United States Patent [19]
Taguchi

[11] Patent Number: 5,339,273
[45] Date of Patent: Aug. 16, 1994

[54] SEMICONDUCTOR MEMORY DEVICE HAVING A TESTING FUNCTION AND METHOD OF TESTING THE SAME

[75] Inventor: Masao Taguchi, Kawasaki, Japan

[73] Assignee: Fujitsu Ltd., Kanagawa, Japan

[21] Appl. No.: 806,406

[22] Filed: Dec. 13, 1991

[30] Foreign Application Priority Data

Dec. 14, 1990 [JP] Japan ................... 2-410668

[51] Int. Cl.⁵ .................. G11C 29/00; G11C 7/00
[52] U.S. Cl. .................... 365/201; 365/149; 365/205
[58] Field of Search ............ 365/149, 200, 201, 184, 365/205; 371/21.1

[56] References Cited

U.S. PATENT DOCUMENTS 4,799,197  1/1989  Kodama et al. ............. 365/149 X
4,956,819  9/1990  Hoffmann et al. .............. 365/201

FOREIGN PATENT DOCUMENTS 58-128077  7/1983  Japan .
62-84499   4/1987  Japan .
62-86600   4/1987  Japan .
63-140498  6/1988  Japan .
2-143984   6/1990  Japan .

Primary Examiner—Eugene R. LaRoche
Assistant Examiner—Son Dinh
Attorney, Agent, or Firm—Armstrong, Westerman, Hattori, McLeland & Naughton

[57] ABSTRACT

A semiconductor memory device is provided with a plurality of bit lines, a plurality of word lines, a memory cell array including a plurality of memory cells each coupled to one bit line and one word line, and a varying part for varying a capacitance of at least a selected one of the bit lines in response to a predetermined signal which indicates a test mode in which an operation of the semiconductor memory device is tested.

15 Claims, 7 Drawing Sheets

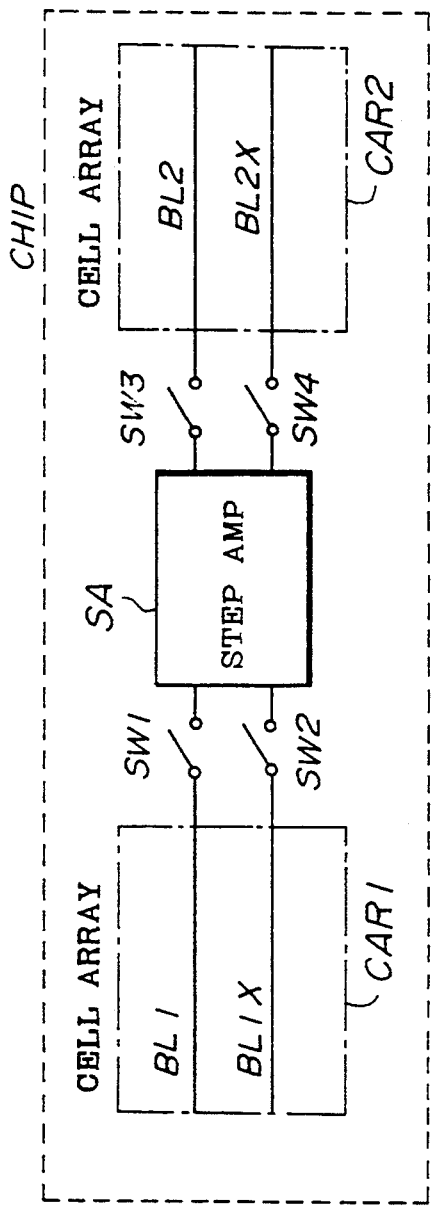

FIG. 7(a)

| O | 1⁺ | O | 1⁺ |
|---|----|---|----|
| 1⁺ | O | 1⁺ | O |
| O | 1⁺ | O | 1⁺ |
| 1⁺ | O | 1⁺ | O |

FIG. 7(b)

| 1⁺ | O | 1⁺ | O |
|----|---|----|---|
| O | 1⁺ | O | 1⁺ |
| 1⁺ | O | 1⁺ | O |
| O | 1⁺ | O | 1⁺ |

FIG. 7(c)

| O⁻ | 1 | O⁻ | 1 |
|----|---|----|---|
| 1 | O⁻ | 1 | O⁻ |
| O⁻ | 1 | O⁻ | 1 |
| 1 | O⁻ | 1 | O⁻ |

FIG. 7(d)

| 1 | O⁻ | 1 | O⁻ |
|---|----|---|----|
| O⁻ | 1 | O⁻ | 1 |
| 1 | O⁻ | 1 | O⁻ |
| O⁻ | 1 | O⁻ | 1 |

FIG. 8(a)

| O | 1 | O | 1 |
|---|---|---|---|
| 1 | O | 1 | O |
| O | 1 | O | 1 |
| 1 | O | 1 | O |

FIG. 8(b)

| 1 | O | 1 | O |
|---|---|---|---|
| O | 1 | O | 1 |
| 1 | O | 1 | O |
| O | 1 | O | 1 |

SEMICONDUCTOR MEMORY DEVICE HAVING A TESTING FUNCTION AND METHOD OF TESTING THE SAME

BACKGROUND OF THE INVENTION

The present invention generally relates to semiconductor memory devices and methods of testing the same, and more particularly to a semiconductor memory device having a testing function and a method of testing such a semiconductor memory device.

As the integration density of semiconductor memory devices improve, the time required to test the produced memory chips increases considerably. The main reason for the considerable increase in the testing time is due to the fact that the operating speed of the memory has not been improved considerably relative to the increase in the number of bits. The testing time can be determined from "the operating time per bit"×"the number of bits"×"the coefficient which is determined by the test pattern"/"number of bits tested simultaneously in parallel". As a result, the cost involved in testing the memory chip makes up a large percentage of the cost of the memory chip.

The test is used to detect and exclude the bits which are clearly defective. But the test is also used to detect and exclude bits which are unstable and become defective depending on the conditions. The testing time required to detect the latter type of bits is considerably long. However, because the test must be completed within a limited time, it is difficult in actual practice to take a sufficiently long time to test each bit.

Conventionally, there is a method of testing unstable bits of a dynamic random access memory (DRAM) by reducing the charge of the memory cell by some means, so as to forcibly reduce the output voltage of the memory cell from the regular value. By forcibly reducing the output voltage of the memory cell, the DRAM is put into a state where an error is more likely to occur so that it becomes possible to correctly detect a defect which would otherwise be considered normal during a normal test cycle. Such an error is more likely to occur in a memory cell which has a small capacitance due to some abnormal cause, a memory cell in which the pn junction and the transistor easily leak thereby causing a quick decrease in the charge, and a sense amplifier which has a poor sensitivity due to some abnormality. Particularly, the output voltage of the memory cell can be forcibly reduced by setting the voltage of a cell plate (counter electrode of the stacked capacitor) of the DRAM cell to different values for the write and read operations, so as to modulate the charge stored in the DRAM cell.

For example, when writing a data "1" into the memory cell and thereafter reading out this data, the apparent stored charge is reduced if the cell plate voltage is reduced during the read operation when compared to that during the write operation. In this manner, it is possible to forcibly reduce the output voltage of this data "1". Particularly, when the write operation is made by setting the cell plate voltage $V_{CP}$ to 2.5 V and the bit line voltage $V_{BL}$ to 5 V, the cell voltage $V_C$ becomes $V_C=V_{BL}-V_{CP}=2.5$ V and the charge Q stored in the memory cell is a product of this cell voltage $V_C$ and the capacitance C of the memory cell. When the read operation is made by setting the cell plate voltage $V_{CP}$ to $V_{CP}=1.5$ V, the bit line voltage $V_{BL}$ becomes $V_{BL}=V_{CP}+V_C=4$ V which is 1 V lower than the bit line voltage of 5 V which is used when making the normal read operation at $V_{CP}=2.5$.

The charge within the memory cell having a poor charge holding characteristic decreases after the level "1" is written therein, and according to the above described method, the decrease of this level "1" is made more conspicuous by forcibly reducing the output voltage of the memory cell, thereby making it possible to detect the unstable memory cell as a defective memory cell.

The method of reducing the cell plate voltage during the read operation can detect the memory cell which has an unstable level "1". However, in order to detect the memory cell which has an unstable level "0", it is necessary to increase the cell plate voltage during the read operation compared to that during the write operation. Generally, when the cause of the defective memory cell is due to the pn junction leak within the memory cell, only the decrease of the level "1" occurs and there is no modulation of the level "0". For this reason, it is sufficient to simply reduce the cell plate voltage when detecting the defective memory cell if only the storage electrode and the capacitor are taken into consideration. However, in the case of a memory cell such that the bit line and the word line are becoming short-circuited, the defective bit is caused by the modulation of the level "0". In other words, if the selected memory cell holds the level "0" and the word line and the bit line are short-circuited when reading from this selected memory cell, the bit line voltage is pulled towards the high level via the word line, and the defect is detected because the read data appears as if the level "1" were read.

Therefore, in order to guarantee no leak of the memory cell for both the level "1" and the level "0", the modulation of the cell plate voltage must be made for the level "1" and for the level "0" and the test must be carried out twice. The above leak of the memory cell refers to a failure other than an evident short-circuit which can be simply detected, such that a current leak occurs via a high resistance thereby causing an unstable operation of the memory cell. If the test is not carried out twice, it becomes necessary to employ a production process which guarantees that no leak will occur between the bit line and the word line. But such a production process generally requires the memory cells to have a relatively large size in order to facilitate the production, and as a result, the chip size becomes large and the production cost increases. On the other hand, the cost of the test increases if the test is carried out twice.

According to the conventional method of detecting the bits with the unstable operation (hereinafter referred to as "screening"), the cell plate voltage must be varied to detect the instability (leak relates to the storage electrode and the capacitor) with respect to the data "1" and to detect the instability (leak between the bit line and the word line) with respect to the data "0" for each cycle in the case of a data pattern such as "marching" which is used when the special operation of reducing the output voltage of the memory cell is made during read and write operations which are carried out alternatively. However, in actual practice, the cell plate voltage cannot be varied at a sufficiently high speed which follows the minimum operation cycle because of the relatively large cell plate capacitance. For this reason, there is a problem in that the required testing time is long.

SUMMARY OF THE INVENTION

Accordingly, it is a general object of the present invention to provide a novel and useful semiconductor memory device having a testing function and a method of testing such a semiconductor memory device, according to which the above described problems are eliminated.

Another and more specific object of the present invention is to provide a semicondcutor memory device comprising a plurality of bit lines, a plurality of word lines, at least one memory cell array including a plurality of memory cells, each of the memory cells being coupled to one bit line and one word line, and varying means, coupled to the bit lines, for varying a capacitance of at least a selected one of the bit lines in response to a predetermined signal which indicates a test mode in which an operation of the semiconductor memory device is tested. According to the semiconductor memory device of the present invention, it is possible to test the operation of the semiconductor memory device simultaneously for the data "0" and the data "1" by varying the bit line capacitance in the test mode. Hence, it is possible to quickly detect not only clearly defective memory cells but also a sense amplifier having a poor sensitivity and memory cells which undergo unstable operation under severe operating conditions. Furthermore, it is unnecessary to carry out the troublesome operation of changing the cell plate voltage mutually different voltages during the write and read cycles, and the test time can be reduced compared to the conventional case.

Still another object of the present invention is to provide a semiconductor memory device comprising at least first and second bit line groups respectively including a plurality of bit lines, a plurality of word lines, at least first and second memory cell arrays respectively including a plurality of memory cells, where each of the memory cells of the first memory cell array is coupled to one bit line of the first bit line group and one word line and each of the memory cells of the second memory cell array is coupled to one bit line of the second bit line group and one word line, a sense amplifier for amplifying a potential difference on a selected bit line pair, and switching means, coupled to the first and second bit line groups and responsive to a control signal, for coupling one of the first and second bit line groups to the sense amplifier during a normal read/write operation of the semiconductor memory device and for coupling both the first and second bit line groups to the sense amplifier in a test mode in which an operation of the semiconductor memory device is tested, where the bit line of the first bit line group has a first capacitance during the normal read/write operation and has a second capacitance which is greater than the first capacitance in the test mode. According to the semiconductor memory device of the present invention, it is possible to test the operation of the semiconductor memory device simultaneously for the data "0" and the data"1" by varying the bit line capacitance in the test mode. Hence, it is possible to quickly detect not only clearly defective memory cells but also a sense amplifier having a poor sensitivity and memory cells which undergo unstable operation under severe operating conditions. In addition, it is unnecessary to carry out the troublesome operation of changing the cell plate voltage mutually different voltages during the write and read cycles, and the test time can be reduced compared to the conventional case. Moreover, the bit line capacitance can be varied in the test mode by a simple switching of the switching means.

A further object of the present invention is to provide a method of testing an operation of a semiconductor memory device which comprises a plurality of bit lines, a plurality of word lines, at least one memory cell array including a plurality of memory cells, where each of the memory cells is coupled to one bit line and one word line and the method comprises the steps of (a) varying a capacitance of at least a selected one of the bit lines in a test mode in which the operation of the semiconductor memory device is tested, (b) writing test data into the memory cells coupled to a selected bit line, and (c) reading the stored test data from the memory cells coupled to the selected bit line. According to the method of the present invention, it is possible to test the operation of the semiconductor memory device simultaneously for the data "0" and the data "1" by varying the bit line capacitance in the test mode. Hence, it is possible to quickly detect not only clearly defective memory cells but also a sense amplifier having a poor sensitivity and memory cells which undergo unstable operation under severe operating conditions. Furthermore, it is unnecessary to carry out the troublesome operation of changing the cell plate voltage mutually different voltages during the write and read cycles, and the test time can be reduced compared to the conventional case.

Other objects and further features of the present invention will be apparent from the following detailed description when read in conjunction with the accompanying drawings.

BRIEF DESCRIPTION OF THE DRAWINGS

FIG. 1 is a system block diagram for explaining the operating principle of the present invention;

FIG. 2 is a diagram for explaining operation modes of the present invention;

FIGS. 7(a)–7(d) and 8(a) and 8(b) are diagrams for explaining the effects of the present invention.

DESCRIPTION OF THE PREFERRED EMBODIMENTS

Figure 3:
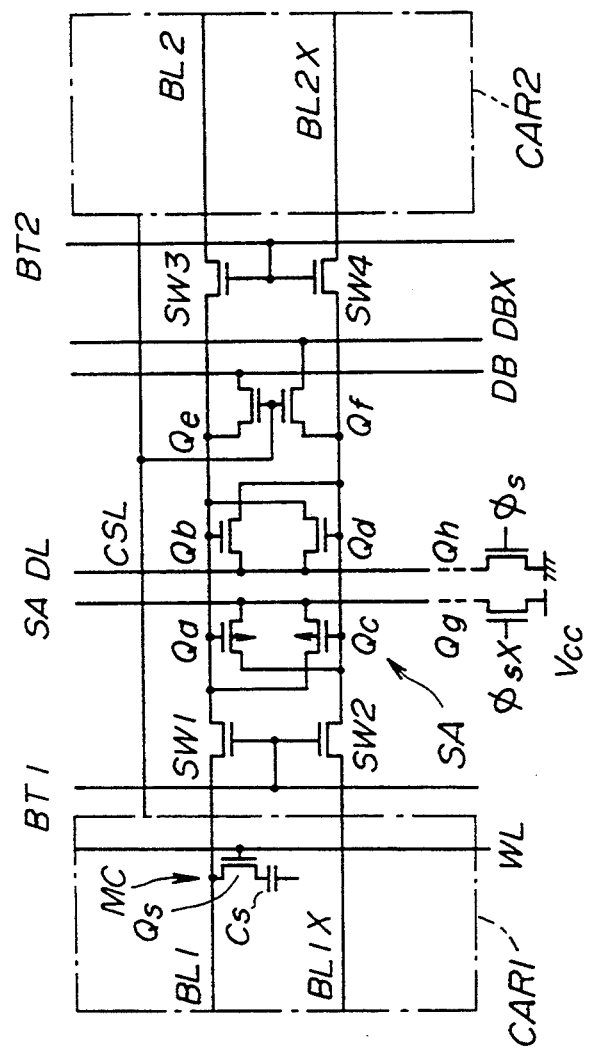
FIG. 3 is a circuit diagram showing an essential part of an embodiment of a semiconductor memory device according to the present invention.

First, a description will be given of the operating principle of the present invention, by referring to FIGS. 1 and 2. FIG. 1 shows an essential part of a semiconductor memory device according to the present invention, and FIG. 2 is a diagram for explaining operation modes of the present invention.

In FIG. 1, a cell array CAR1 is coupled to a sense amplifier SA via switches SW1 and SW2, and a cell array CAR2 is coupled to the sense amplifier SA via switches SW3 and SW4. The switches SW1 and SW2 are switched at the same time, while the switches SW3 and SW4 are switched at the same time. Depending on the connection of the switches SW1 through SW4, the sense amplifier SA amplifies a voltage difference of bit lines BL1 and BL1X of the cell array CAR1 or a voltage difference of bit lines BL2 and BL2X of the cell array CAR2. In this specification, an "X" is used in place of a bar (—) to indicate complementary signals.

During a normal memory operation, the switches SW1 and SW2 are ON when the switches SW3 and SW4 are OFF, and on the other hand, the switches SW1 and SW2 are OFF when the switches SW3 and SW4 are ON, as shown in FIG. 2. Hence, the single sense amplifier SA can be used for two pairs of bit lines, and the chip area can be reduced because the number of sense amplifiers can be reduced. In other words, the so-called shared sense amplifier system is employed in the case shown in FIG. 1. However, it is of course possible to apply the present invention to systems other than the shared sense amplifier system.

In a test mode in which the screening described above is made, all of the switches SW1, SW2, SW3 and SW4 are turned ON simultaneously, as shown in FIG. 2. Of course, the memory cell to be tested is selected from only one of the cell arrays CAR1 and CAR2.

When the switches SW1 and SW2 respectively connected to the bit lines BL1 and BL1X of the cell array CAR1 and CAR2 and the switches respectively connected to the bit lines BL2 and BL2X of the cell array CAR2 are turned ON at the same time in the test mode, the bit line capacitance becomes twice that during the normal memory operation and the cell output voltage decreases.

If the storage capacitance of the memory cell is denoted by $C_S$, the bit line capacitance by $C_b$ and the sense amplifier input capacitance by $C_a$, an output voltage $\Delta V$ of the memory cell applied to the bit line during the normal memory operation can be described by the following formula, where $V_d$ denotes the storage voltage within the memory cell corresponding to the stored data and $V_p$ denotes the precharge voltage of the bit line (that is, the voltage of the bit line which is in the floating state during the read operation).

$$\Delta V = [C_S/(C_b + C_a + C_S)] \times (V_d - V_p)$$

On the other hand, in the test mode, the bit line capacitance $C_b$ becomes twice that during the normal memory operation because all of the switches SW1 through SW4 turn ON, and an output voltage $\Delta V_{test}$ of the memory cell can be described by the following formula.

$$V_{test} = [C_S/(2C_b + C_a + C_S)] \times (V_d - V_p)$$

The ratio $C_b/C_S$ is referred to as the C ratio and takes a value of approximately 10. If it is assumed that this C ratio is 10 and the sense amplifier input capacitance $C_a$ is 20% of the bit line capacitance $C_b$, the output voltage $\Delta V$ of the memory cell during the normal memory operation becomes as follows.

$$\Delta V = (1/13) \times (V_d - V_p) = 0.0770 \times (V_d - V_p)$$

On the other hand, the output voltage $\Delta V_{test}$ of the memory cell in the test mode becomes as follows, and it can be seen that the cell output voltage in the test mode can be reduced compared to that during the normal memory operation.

$$\Delta V_{test} = (1/23) \times (V_d - V_p) = 0.0435 \times (V_d - V_p)$$

It should be noted that the storage voltage $V_d$ within the memory cell is included in the formula which describes the output voltage $\Delta V_{test}$ of the memory cell in the test mode. This means that the cell output voltage can be reduced for both the stored data "0" and "1" within the memory cell. Therefore, it becomes possible to detect a memory cell having a weak output signal and a sense amplifier having a poor sensitivity, which have a high possibility of causing an erroneous operation during the normal memory operation.

Next, a description will be given of an embodiment of the semiconductor memory device according to the present invention, by referring to FIG. 3. This embodiment employs an embodiment of a method of testing the semiconductor memory device. In FIG. 3, those parts which are the same as those corresponding parts in FIG. 1 are designated by the same reference numerals, and a description thereof will be omitted.

In FIG. 3, MOSFETs are used for the switches SW1 through SW4 which switch the bit lines BL1, BL1X, BL2 and BL2X. The gate voltages of the switches SW1 and SW2 are controlled by a clock signal BT1, while the gate voltages of the switches SW3 and SW4 are controlled by a clock signal BT2.

Figure 4:
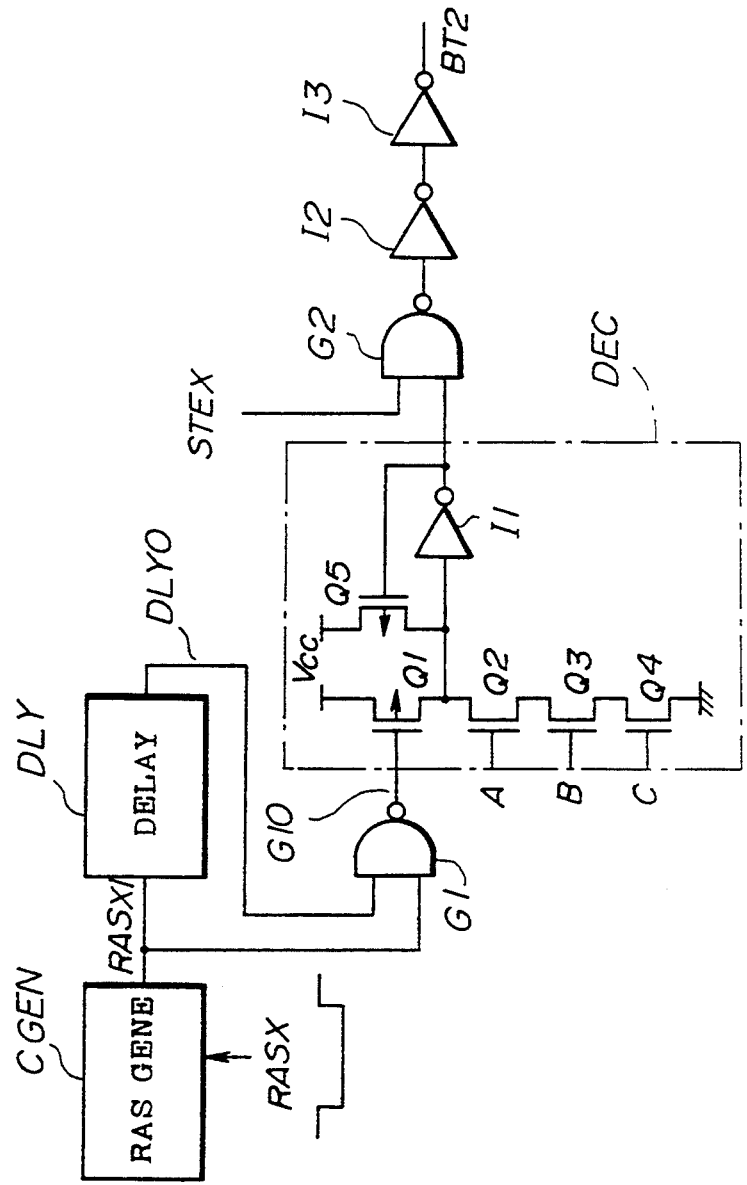
FIG. 4 is a circuit diagram showing an embodiment of a control circuit for generating clock signals which are used in the first embodiment.

FIG. 4 shows an embodiment of a control circuit for generating the clock signal BT2. The clock signal BT1 can be generated by a similar control circuit, as will be described later.

The control circuit shown in FIG. 4 includes a row address strobe (RAS) generator CGEN, a delay circuit DLY, gates G1 and G2, inverters I2 and I3, and a decoder DEC which are connected as shown. The decoder DEC includes transistors Q1 through Q5 and an inverter I1 which are connected as shown. The p-channel MOS transistor Q1 receives an output of the NAND gate G1. The n-channel MOS transistors Q2, Q3 and Q4 of the decoder DEC respectively receive bits A, B and C of the cell array address. The p-channel MOS transistor Q5 receives an output of the inverter I1.

Figure 9:
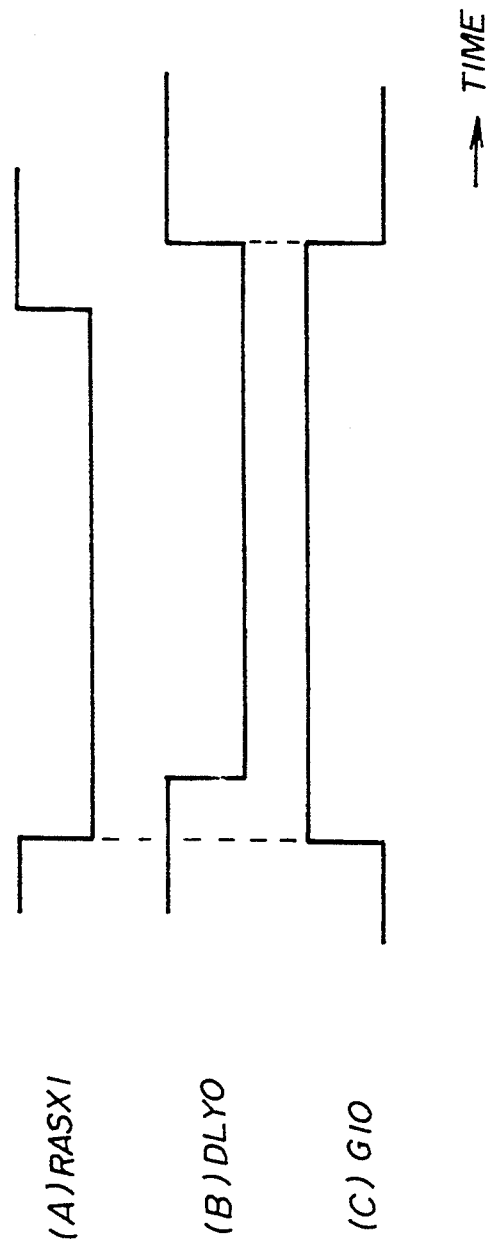
FIG. 9 is a timing chart for explaining the operation of the control circuit shown in FIG. 4.

In FIG. 4, the RAS generator CGEN generates a RASX1 (internal clock used within the chip) shown in FIG. 9(A) in response to an external RASX which is applied from outside the chip. The waveform of the RASX1 follows that of the RASX. The RASX1 normally has a high level, and has a low level during an access mode. If the RASX1 has the high level and a sufficiently long time has elapsed after the RASX1 becomes high, an output signal level DLYO of the delay circuit DLY shown in FIG. 9(B) becomes high, and an output signal level G1O of the NAND gate G1 accordingly becomes low as shown in FIG. 9(C). The output signal level G1O of the NAND gate G1 becomes high when the RASX1 becomes low, and the output signal G1O of the NAND gate G1 returns to the low level after a delay time $\tau$ which is set in the delay circuit DLY when the RASX1 returns to the high level from the low level. In other words, the return of the output signal G1O of the NAND gate G1 from the high level to the low level is delayed by the delay time $\tau$. This delay is required to finally reset the row address, that is, cancel the operation of the decoder DEC.

When the output signal level G1O of the NAND gate G1 is low, the p-channel MOS transistor Q1 turns ON and the input signal level of the inverter I1 becomes high. Hence, the output signal level of the inverter I1 becomes low and the p-channel MOS transistor Q5 turns ON. Therefore, the decoder DEC is precharged.

On the other hand, when the output signal level G10 of the NAND gate G1 becomes high, the transistor Q1 turns OFF and the input signal level of the inverter I1 becomes low if the transistors Q2 through Q4 all turn ON responsive to the address bits A, B and C, that is, if the cell array CAR1 is selected. In this case, the output signal level of the inverter I1 becomes high. In other words, the transistor Q1 is OFF during the high-level period of the signal G10 shown in FIG. 9(C), and the transistor Q1 is otherwise OFF. Because the test mode signal STEX has the high level during the normal read/write operation, the output signal level of the gate G2 is low, the clock signal BT2 has the low level, and the switches SW3 and SW4 are thus OFF. Therefore, the circuit shown in FIG. 4 has the function of opening the switches SW3 and SW4 of the cell array CAR2 which is provided on the opposite side of the selected cell array CAR1 relative to the sense amplifier SA.

Returning now to the description of FIG. 3, MOS transistors Qa through Qd form the sense amplifier SA, and this sense amplifier SA is driven by signals received via a pair of sense amplifier driving lines SADL. Transistors Qg and Qh which are connected to the sense amplifier driving lines SADL respectively receive sense enable clock signals $\phi_s$ and $\phi_s X$. Hence, one sense amplifier driving line SADL is coupled to a power source Vcc via the transistor Qg, while the other sense amplifier driving line SADL is coupled to the ground via the transistor Qh. A column selection line CSL transfers a signal for turning ON/OFF MOS transistors Qe and Qf which respectively couple the bit lines BL and BLX to data buses DB and DBX. Each memory cell MC is a 1-transistor-1-capacitor type comprising a MOS transistor $Q_s$ which is used as a transfer gate and a capacitor $C_s$. This capacitor $C_s$ is not a MOS type, but is a normal type (metal-dielectric-metal type) having polysilicon electrodes.

The normal read/write operation is carried out in the known manner. When reading data from a memory cell MC within the cell array CAR1, the word line WL of the cell array CAR1 is selected and the selected memory cell MC is connected to the bit line BL1 which is precharged in advance. As a result, a potential difference occurs between the bit lines BL1 and BL1X. On the other hand, the clock signal BT2 is set to a low level to open the switches SW3 and SW4 in order to connect the bit lines BL1 and BL1X to the sense amplifier SA and disconnect the bit lines BL2 and BL2X from the sense amplifier SA, so as to amplify the potential difference between the bit lines BL1 and BL1X. Next, a column select signal on the column selection line CSL is set to a high level to turn ON the transistors Qe and Qf so that the potentials of the selected bit lines BL1 and BL1X are transferred to the corresponding data buses DB and DBX.

The read operation can be made similarly when reading data from a memory cell MC within the cell array CAR2. Of course, in this case, the clock signal BT1 is set to a low level to disconnect the bit lines BL1 and BL1X from the sense amplifier SA and to connect the bit lines BL2 and BL2X to the sense amplifier SA.

A test mode signal STEX which is supplied to the NAND gate G2 shown in FIG. 4 has a high level during the normal read/write operation. For this reason, the NAND gate G2 is open during the normal read/write operation, and the clock signal BT2 is dependent on the output signal of the decoder DEC. On the other hand, the test mode signal STEX has a high level in the test mode. As a result, the output signal of the NAND gate G2 becomes fixed to a high level in the test mode, regardless of the output signal level of the decoder DEC. Hence, the clock signal BT2 has a high level in the test mode.

In a control circuit (not shown) which generates the clock signal BT1, the clock signal BT1 is generated similarly to the clock signal BT2 and the clock signal BT1 has a high level in the test mode. In this case, the same circuit construction as that shown in FIG. 4 may be used, however, the transistor Q2 receives an inverted address bit AX, and the transistors Q3 and Q4 respectively receive the address bits B and C.

Accordingly, the switches SW1 through SW4 all close in the test mode, and the length of the bit lines becomes twice that during the normal read/write operation. The memory cell selection (or word line selection) is made from only one of the cell arrays CAR1 and CAR2 during the normal read/write operation and also in the test mode. For this reason, the output voltage $\Delta V_{test}$ of the selected memory cell MC decreases in the test mode regardless of whether the data stored in this selected memory cell MC is "1" or "0".

The test mode signal STEX may be supplied to the gate G2 in various manners. For example, a test terminal can be provided on the chip for receiving the test mode signal STEX which has the low level in the test mode. It is also possible to enter the test mode by setting the test mode signal STEX to the low level in the so-called WCBR (Write-CAS-Before-RAS) mode. In the WCBR mode, the RASX is set to the low level before the write enable WEX and the CASX are set to the low level, and the RASX is thereafter set to the low level to enter the test mode. Furthermore, it is possible to enter the test mode by setting the test mode signal STEX to the low level using a specific address code.

Figure 5:
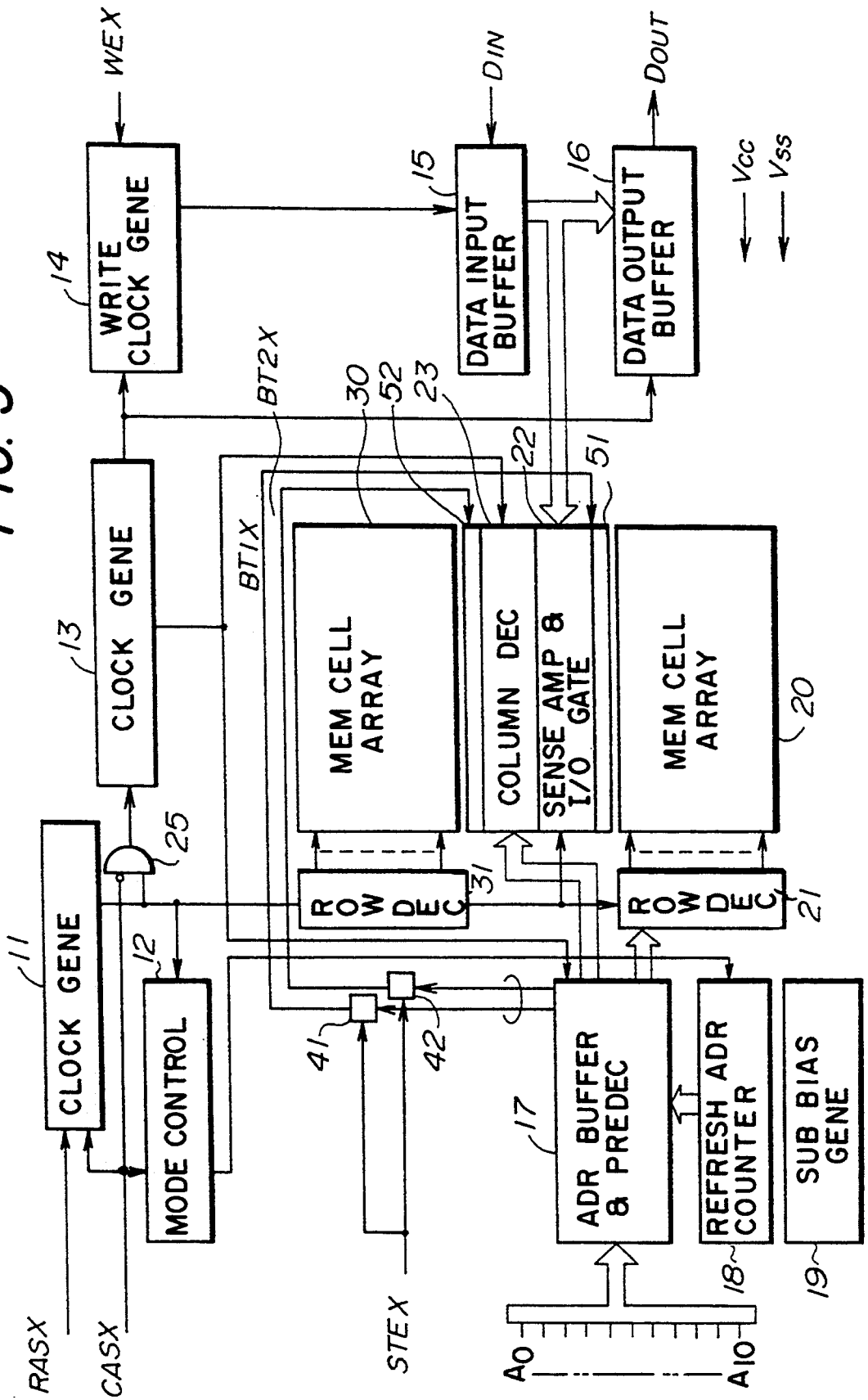
FIG. 5 is a system block diagram generally showing the embodiment of the semiconductor memory device.

FIG. 5 is a system block diagram showing the general construction of the embodiment of the semiconductor memory device. The semiconductor memory device shown in FIG. 5 includes a clock generator 11, a mode controller 12, a clock generator 13, a write clock generator 14, a data input buffer 15, a data output buffer 16, an address buffer and predecoder part 17, a refresh address counter 18, a substrate bias generator 19, a memory cell array 20, a row decoder 21, a sense amplifier and input/output gate part 22, a column decoder 23, a gate 25, a memory cell array 30, a row decoder 31, control circuits 41 and 42, and switching parts 51 and 52 which are connected as shown. Parts other than the control circuits 41 and 42 and the switching parts 52 and 53 are known. Hence, it may be seen that only a slight modification is required to apply the present invention to the existing semiconductor memory device.

The control circuit 41 generates the clock signal BT1. On the other hand, the control circuit 42 corresponds to the circuit shown in FIG. 4 and generates the clock signal BT2. The memory cell array 20 and 30 respectively correspond to the cell arrays CAR1 and CAR2 shown in FIG. 3. The switching part 51 includes the switches SW1 and SW2 shown in FIG. 3 which control the connection to the memory cell array 20, and the switching part 52 includes the switches SW3 and SW4 shown in FIG. 3 which control the connection to the memory cell array 30. For example, the memory cell arrays 20 and 30 each have 2097152 bits.

The clock generator 11 generates a clock signal in response to the RASX and column address strobe (CASX), and the generated clock signal is supplied to the row decoders 21 and 31, the mode controller 12 and the gate 25. The gate 25 also receives the CASX. The mode controller 12 supplies a control signal to the refresh address counter 18. The clock generator 13 generates two kinds of clock signals based on an output signal of the gate 25. One output clock signal of the clock generator 13 is supplied to the address buffer and predecoder part 17 and the column decoder 23. The other output clock signal of the clock generator 13 is supplied to the write clock generator 14 and the data output buffer 16. The write clock generator also receives a write enable signal WEX, and supplies a write clock signal to the data input buffer 15. The data input buffer 15 receives an input data $D_{IN}$, and the data output buffer 16 outputs an output data $D_{OUT}$.

Address bits A0 through A10 of an address signal are supplied to the address buffer and predecoder 17, and the predecoded address is supplied to the row decoder 21 and the column decoder 23. The address buffer and predecoder 17 also outputs a block switching address. Address bits A, B and C of the block switching address are supplied to the control circuit 41 which outputs the clock signal BT1X, and address bits AX, B and C of the block switching address are supplied to the control circuit 42 which outputs the clock signal BT2X. The clock signals BT1X and BT2X are supplied to the corresponding switching parts 51 and 52.

In the above described embodiment, the present invention is applied to the semiconductor memory device employing the shared sense amplifier system. However, the present invention may be applied to semiconductor memory devices other than the kind employing the shared sense amplifier system. In other words, the present invention is applicable to any semiconductor memory device in which the bit line capacitance may be varied between the normal read/write operation and the test mode, by carrying out a switching to connect a capacitance to the bit line during the test mode, for example.

On the other hand, when the present invention is applied to the semiconductor memory device employing the shared sense amplifier system, the number of memory cell arrays sharing the single sense amplifier is of course not limited to two, and more than two memory cell arrays may share the sense amplifier.

Next, a description will be given of a test sequence of the semiconductor memory device, by referring to FIG. 6.

Figure 6:
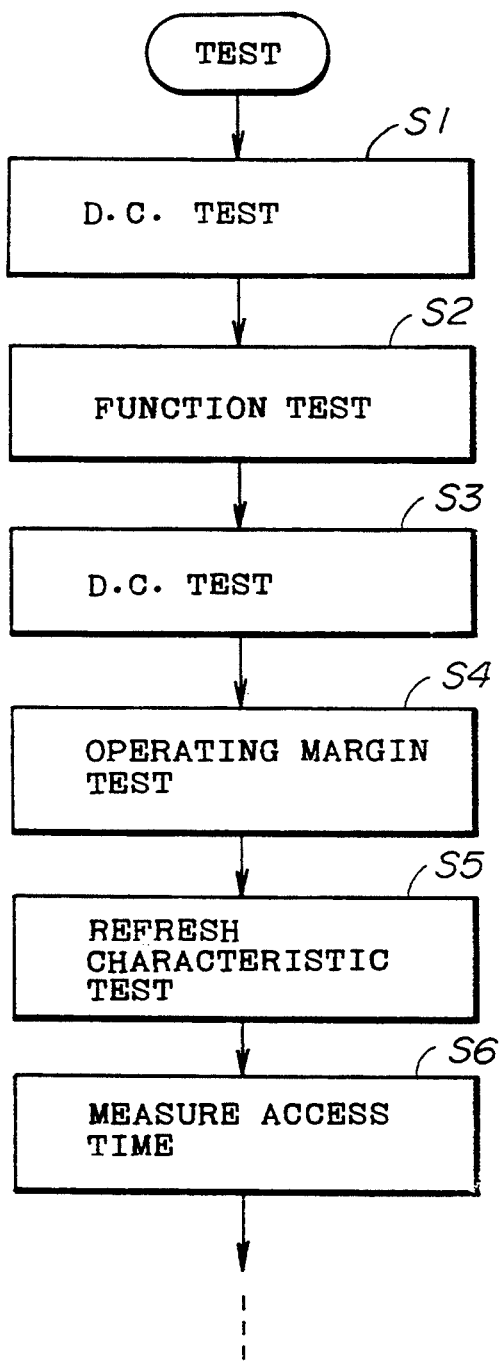
FIG. 6 is a flow chart for explaining a test sequence of the semiconductor memory device.

FIG. 6 shows the test sequence which is carried out in the wafer state of the semiconductor memory device (DRAM). A step S1 carries out a D.C. test such as testing the conduction of input/output terminals and checking the power source current value. A step S2 carries out a function test such as testing functions under standard operating conditions. A step S3 carries out a D.C. test which is more detailed than the D.C. test carried out in the step S1. A step S4 carries out an operation margin test such as testing functions under operating conditions which are more severe than the standard conditions used in the step S2. A step S5 carries out a refresh characteristic test. A step S6 measures the access time of the semiconductor memory device. The semiconductor memory device in the wafer state is mounted on a package (not shown) after the step S6, for example.

The present invention is particularly applicable to the steps S4 and S5 shown in FIG. 6.

When carrying out the operating margin test in the step S4, the output voltage of the memory cell is forcibly reduced so as to determine whether or not the semiconductor memory device operates under such a condition. Hence, by this operating margin test, it is possible to detect two kinds of defects. First, it is possible to detect a memory cell having a capacitor which leaks and the charge held in the memory cell easily decreases. Second, it is possible to detect a memory cell which has a small output voltage and operates erroneously due to a deteriorated sensitivity of the sense amplifier.

The advantage of applying the present invention to the step S4 is that there is no possibility of introducing an erroneous operation of the semiconductor memory device in the test mode as in the case of the conventional method which varies the voltage of the extremely large electrode. It may be regarded that the erroneous operation is introduced when the conventional method is used because a noise voltage is generated within the chip when the voltage of the extremely large electrode is varied.

The refresh characteristic test in the step S5 is carried out to detect whether or not the refresh operation is carried out according to specifications of the semiconductor memory device.

The advantage of applying the present invention to the step S5 is that the memory cell having a poor refresh characteristic can be found quickly by forcibly reducing the cell charge according to the present invention.

Next, a description will be given of the effect of the present invention, by referring to FIGS. 7 and 8.

When testing the semiconductor memory device by writing data into the semiconductor memory device and then reading out the stored data so as to detect the defective memory cells, the so-called checker board data pattern is written into the memory cell array. The checker board data pattern is convenient in that the data values stored in the memory cells surrounding each arbitrary memory cell are different from the data value stored in the arbitrary memory cell, thereby making it possible to detect effects of a defective memory cell on the surrounding memory cells.

According to the conventional method described in the introductory part of the specification, the cell output voltage is increased for the data "1" in the checker board data pattern shown in (a) of FIG. 7 and the checker board data pattern shown in (b) of FIG. 7, where each square shown in FIG. 7 represents a memory cell. Hence, the operation of increasing the cell output voltage (so-called bump-up) must be carried out twice. On the other hand, the cell output voltage is decreased for the data "0" in the checker board data pattern shown in (c) of FIG. 7 and the checker board data pattern shown in (d) of FIG. 7. Thus, the operation of decreasing the cell output voltage (so-called bump-down) must be carried out twice. As a result, a total of four test operations must be carried out in the test mode when the conventional method is used.

On the other hand, when the present invention is employed, the bit line capacitance is increased for the data "1" and the data "0" in the checker board data pattern shown in (a) of FIG. 8 and the checker board data pattern shown in (b) of FIG. 8, where each square shown in FIG. 8 represents a memory cell. Hence, the operation of increasing the bit line capacitance is carried out twice, but in total it is only necessary to carry out two test operations in the test mode when the present invention is employed. Therefore, it may easily be seen that the testing time is considerably reduced compared to the case where the above described conventional method is employed.

Further, the present invention is not limited to these embodiments, but various variations and modifications may be made without departing from the scope of the present invention.

What is claimed is:

1. A semiconductor memory device comprising:
   a sense amplifier;
   two bit line pairs coupled to said sense amplifier via switches;
   a plurality of word lines;
   at least one memory cell array including a plurality of memory cells, each of the memory cells being coupled to one bit line pair and one word line; and
   varying means, coupled to the bit lines, for varying a capacitance of at least a selected one of the bit line pairs in response to a predetermined signal which indicates a test mode in which an operation of the semiconductor memory device is tested, said varying means for increasing the capacitance of the selected bit line pair in the test mode compared to the capacitance of the selected bit line pair during normal read/write operation of the semiconductor memory device, whereby when said two bit line pairs are connected to said sense amplifier via said switches in the test mode, said selected bit line pair functions as a capacitor when the other of the two bit line pairs is in use.

2. The semiconductor memory device as claimed in claim 1, wherein each memory cell includes a transistor which is connected to one bit line and one word line, and a storage capacitor which is connected to the transistor.

3. The semiconductor memory device as claimed in claim 1, wherein said sense amplifier, coupled to the bit line pairs, is further for amplifying a potential difference of a selected bit line pair during the normal read/write operation and in the test mode.

4. The semiconductor memory device as claimed in claim 3, wherein a test data pattern is written into and read out from the memory cells coupled to the selected bit line pair in the test mode, so that a defect including a leak of the memory cell and a poor sensitivity of the sense amplifier is detectable from the read test data.

5. A semiconductor memory device comprising:
   at least first and second bit line groups respectively including a plurality of bit lines;
   a plurality of word lines;
   at least first and second memory cell arrays respectively including a plurality of memory cells, each of the memory cells of the first memory cell array being coupled to one bit line of the first bit line group and one word line, each of the memory cells of the second memory cell array being coupled to one bit line of the second bit line group and one word line;
   a sense amplifier for amplifying a potential difference on a selected bit line pair; and
   switching means, coupled to the first and second bit line groups and responsive to a control signal, for coupling one of the first and second bit line groups to the sense amplifier during a normal read/write operation of the semiconductor memory device and for coupling both the first and second bit line groups to the sense amplifier in a test mode in which an operation of the semiconductor memory device is tested,
   the bit line of the first bit line group having a first capacitance during the normal read/write operation and having a second capacitance which is greater than the first capacitance in the test mode.

6. The semiconductor memory device as claimed in claim 5, wherein said sense amplifier is shared by the first and second memory cell array during the normal read/write operation and in the test mode.

7. The semiconductor memory device as claimed in claim 5, wherein each memory cell includes a transistor which is connected to one bit line and one word line, and a storage capacitor which is connected to the transistor.

8. The semiconductor memory device as claimed in claim 6, wherein a test data pattern is written into and read out from the memory cells coupled to a selected bit line pair of one of the first and second memory cell arrays in the test mode, so that a defect including a leak of the memory cell and a poor sensitivity of the sense amplifier is detectable from the read test data.

9. The semiconductor memory device as claimed in claim 5, which further comprises circuit means for generating the control signal which controls switching of said switching means during the normal read/write operation based on an address signal, and the control signal generated by said circuit means forcibly switches the switching means to couple both the first and second bit line groups to the sense amplifier in response to a predetermined signal which indicates the test mode.

10. The semiconductor memory device as claimed in claim 9, wherein the predetermined signal is an external signal received from outside the semiconductor memory device.

11. A method of testing an operation of a semiconductor memory device which comprises a sense amplifier, two bit line pairs coupled to said sense amplifier via switches, a plurality of word lines, at least one memory cell array including a plurality of memory cells, each of the memory cells being coupled to one bit line pair and one word line, said method comprising the steps of:
   (a) varying a capacitance of at least a selected one of the bit line pairs in a test mode in which the operation of the semiconductor memory device is tested;
   (b) writing test data into the memory cells coupled to the other of the bit line pairs; and
   (c) reading the stored test data from the memory cells coupled to the other bit line pair;
   wherein in step (a), the capacitance of the selected bit line pair is increased in the test mode compared to the capacitance of the selected bit line pair during nornal read/write operation of the semiconductor memory device, whereby when said two bit line pairs are connected to said sense amplifier via said switches in the test mode, said selected bit line pair functions as a capacitor when the other of the two bit line pairs is in use.

12. The method as claimed in claim 11, wherein in said step (c), said sense amplifier, coupled to the bit line pairs, is further for amplifying a potential difference of a selected bit line pair during the normal read/write operation and in the test mode.

13. The method as claimed in claim 12, wherein the test data pattern is read out from the memory cells coupled to the other bit line pair by said step (c) in the test mode, so that a defect including a leak of the memory cell and a poor sensitivity of the sense amplifier is detectable from the read test data.

14. The method as claimed in claim 11, wherein the semiconductor memory device includes at least first and second bit line groups respectively including the pairs of bit lines, at least first and second memory cell arrays respectively including the plurality of memory cells, each of the memory cells of the first memory cell array being coupled to one bit line of the first bit line group and one word line, each of the memory cells of the second memory cell array being coupled to one bit line of the second bit line group and one word line, and a sense amplifier for amplifying a potential difference on a selected bit line pair, one of the first and second bit line groups being coupled to the sense amplifier during a normal read/write operation of the semiconductor memory device, said step (a) coupling both the first and second bit line groups to the sense amplifier in the test mode so that the bit line of the first bit line group has a first capacitance which is greater than a second capacitance of the bit line during the normal read/write operation.

15. A method of testing an operation of a semiconductor memory device which comprises a plurality of bit lines, a plurality of word lines, at least one memory cell array including a plurality of memory cells, each of the memory cells being coupled to one bit line and one word line, said method comprising the steps of:

(a) varying a capacitance of at least a selected one of the bit lines in a test mode in which the operation of the semiconductor memory device is tested;

(b) writing test data into the memory cells coupled to a selected bit line; and (c) reading the stored test data from the memory cells coupled to the selected bit line;

wherein the semiconductor memory device includes at least first and second bit line groups respectively including the plurality of bit lines, at least first and second memory cell arrays respectively including the plurality of memory cells, each of the memory cells of the first cell array being coupled to one bit line of the first bit line group and one word line, each of the memory cells of the second memory cell array being coupled to one bit line of the second bit line group and one word line, and a sense amplifier for amplifying a potential difference on a selected bit line pair, one of the first and second bit line groups being coupled to the sense amplifier during a normal read/write operation of the semiconductor memory device; and in said step (a), coupling both the first and second bit line groups to the sense amplifier in the test mode so that the bit line of the first bit line group has a first capacitance which is greater than a second capacitance of the bit line during the nornal read/write operation.

* * * * *